United States Patent [19]
Buhaenko et al.

[11] Patent Number: 5,961,719
[45] Date of Patent: Oct. 5, 1999

[54] NUCLEATION OF DIAMOND FILMS USING AN ELECTRODE

[75] Inventors: David Stephen Buhaenko, Dallas, Tex.; Carolyn Elizabeth Beer, Glamorgan, United Kingdom; Peter John Ellis, Cary, N.C.

[73] Assignee: Kabushiki Kaisha Kobe Seiko Sho, Kobe, Japan

[21] Appl. No.: 08/640,505

[22] Filed: May 1, 1996

[30] Foreign Application Priority Data

May 1, 1995 [GB] United Kingdom ............... 9508835

[51] Int. Cl.⁶ ............... B05D 3/06; C23C 16/26; C30B 29/04; H05H 1/30
[52] U.S. Cl. ............... 117/103; 117/85; 117/88; 117/929; 423/446; 427/575; 427/577
[58] Field of Search ............... 117/85, 88, 103, 117/929; 427/575, 577; 423/446

[56] References Cited

U.S. PATENT DOCUMENTS

| | | |
|---|---|---|
| 5,094,878 | 3/1992 | Yamamoto et al. ............... 427/562 |
| 5,370,912 | 12/1994 | Bigelow et al. ............... 427/575 |
| 5,371,383 | 12/1994 | Miyata et al. . |
| 5,402,029 | 3/1995 | Nakamura et al. . |
| 5,424,561 | 6/1995 | Tachibana et al. . |
| 5,442,199 | 8/1995 | Saito et al. . |
| 5,471,947 | 12/1995 | Southworth et al. ............... 117/94 |
| 5,476,693 | 12/1995 | Lee et al. ............... 427/577 |
| 5,491,348 | 2/1996 | Koyamao et al. . |
| 5,493,131 | 2/1996 | Miyata et al. . |
| 5,512,873 | 4/1996 | Saito et al. . |
| 5,523,160 | 6/1996 | Kobashi et al. . |

*Primary Examiner*—Benjamin Utech
*Assistant Examiner*—Donald L. Champagne
*Attorney, Agent, or Firm*—Oblon, Spivak, McClelland, Maier & Neustadt, P.C.

[57] ABSTRACT

Method and apparatus are disclosed for growing diamond films on a non-diamond substrate, such as a silicon wafer. The substrate surface is subjected to nucleation by means of a microwave-generated plasma while applying an electrical bias to the substrate and while an electrode is positioned adjacent to but spaced from the substrate surface. After the nucleation step, crystalline diamond is deposited on the nucleated surface from a carbon-containing plasma.

10 Claims, 9 Drawing Sheets

(100) TEXTURED DIAMOND FILM GROWN AT HIGH MICROWAVE POWER WITH THE RING ELECTRODE IN PLACE

FIG. 8

INCREASED FACET SIZE GROWN AT ONE EDGE OF
THE HIGHLY ORIENTED DIAMOND REGION

FIG. 9

CROSS-SECTION OF HIGHLY ORIENTED DIAMOND REGION HIGHLIGHTING INCREASED GROWTH RATE AND HIGHLY COLUMNAR GRAIN STRUCTURE

NUCLEATION OF DIAMOND FILMS USING AN ELECTRODE

This invention is concerned with the preparation of diamond films on diamond and non-diamond substrates, such as silicon wafers, for use in the fabrication of electronic devices and other products requiring chemical vapour deposited diamond.

In our British Patent Application No. 9317830.7 (Publication No. 270326 corresponding U.S. application is now U. S. Pat. No. 5,471,947), there is described a method of growing an oriented diamond film on a silicon substrate, in which the substrate is pretreated in a chemical vapour deposition chamber to effect nucleation of its surface, by subjecting the surface of the substrate to an electrical bias. The exposure of the surface of the substrate to a plasma under these conditions is found to substantially increase the density of nucleation of the surface.

It would be an advantage to be able to control the energy and density of the species responsible for diamond nucleation in order to establish optimum conditions for subsequent diamond growth.

The present invention is based on the discovery that the introduction of a separate electrode into the plasma above the substrate surface influences the species acting on the substrate surface. Also, changes in the nucleation pattern of the surface and the subsequent diamond growth phase can be influenced by varying the position of the electrode with respect to the substrate surface, and by imposing different electrical biasing conditions on the electrode and the substrate.

According to one aspect of the present invention there is provided a method of growing an oriented diamond film by microwave chemical vapour deposition (CVD) on a non-diamond substrate which comprises effecting nucleation of the substrate surface for oriented diamond growth by subjecting the surface to a microwave generated plasma while applying an electrical bias to the substrate surface, wherein an electrode is introduced above or adjacent to the substrate surface and crystalline diamond is deposited on the resulting nucleated surface from a carbon-containing plasma.

We have observed that the shape of the electrode affects the characteristics of the plasma in terms of its shape, size, stability, density and ion energy. This interaction can be used to advantage, for example, in tailoring the plasma for large area uniform diamond nucleation or nucleation at selected areas of the substrate surface. In the case of large area, uniform diamond nucleation, the electrode is preferably substantially planar and is positioned in such a way that its plane lies substantially parallel to the substrate surface. The invention is not restricted to the use of an electrode having a specific geometry, but an open grid, ring or frame has been found to give satisfactory results. The frame or ring may be crossed to form a mesh-like structure. Openings of 2 mm across to 50 mm across have been used, preferably from 5 to 50 mm.

The electrode may be of more complex structure and more than one electrode may be employed.

The electrode should be made from a material which is both conductive and can withstand the temperature of the plasma. Examples of suitable materials are molybdenum, tungsten, tantalum, hafnium, nickel and titanium.

The nucleation of the silicon substrate is affected by the voltage applied to the electrode. It is not always necessary to apply the bias directly to the electrode, since a negative bias applied to the substrate will induce an electrical bias in the electrode. However, for increased flexibility, both the substrate and the grid are preferably connected to respective means or the same means for applying electrical bias to the electrode and substrate. While the bias voltage applied to the electrode can be controlled, an alternative method of controlling the electrical bias is to control the current flowing in the electrode.

Current control to achieve a current density within the range of 1 to 20 $mA/cm^2$, preferably 1 to 10 $mA/cm^2$ is a useful way of controlling the electrical bias applied to the electrode. However, in general, an electrode bias voltage of from 60 to 600V, e.g. 60 to 350V may be employed.

It is highly desirable to monitor the nucleation treatment of the substrate. This is best carried out using an optical pyrometer and detecting the end point using the technique described in our above pending British Patent Application. For this reason, it is desirable to select the geometry of the components in the diamond growth chamber such that it is possible to view the surface of the substrate using an optical pyrometer which has sight of the substrate surface. One convenient method employed by the inventors is to view the substrate surface through the electrode. This does not present a problem when using simple electrode structures, such as a ring or grid. In the case of a grid, a grid spacing of at least about 3 mm, preferably 4 to 5 mm or more is preferred.

Prior to the nucleation step, the silicon substrate is preferably subjected to a pre-conditioning pre-treatment, such as immersing the heated substrate in a carbon-containing plasma. A typical pretreatment method is described in our above pending British Patent Application.

The invention will now be described with reference to the accompanying drawings in which:

BRIEF DESCRIPTION OF THE DRAWINGS

FIGS. 10(*a*) and (*b*) are schematic circuit diagrams showing arrangements for biasing the electrode and substrate.

Figure 1:
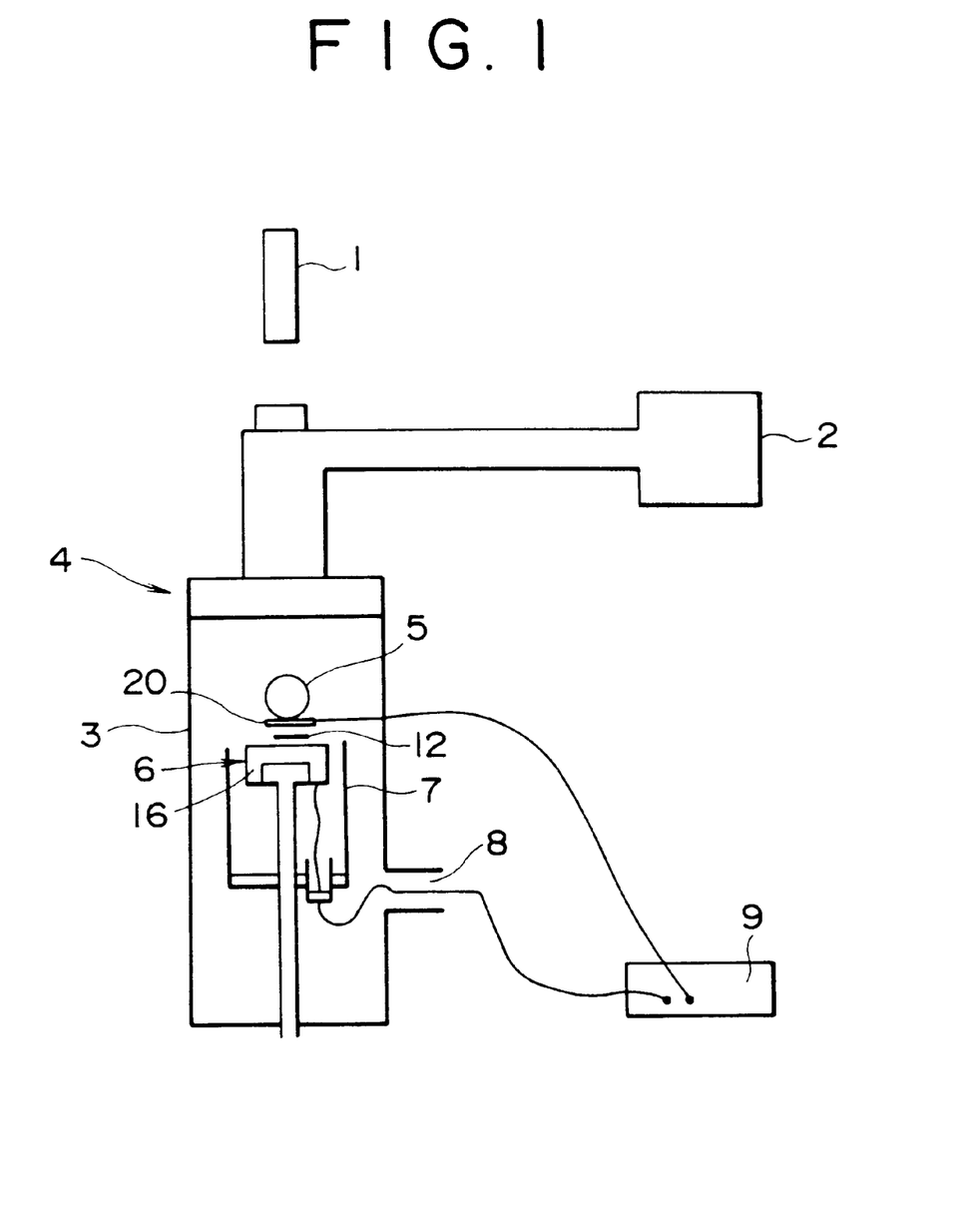
FIG. 1 is a schematic side elevation of a microwave CVD apparatus in accordance with the invention.
Figure 5:
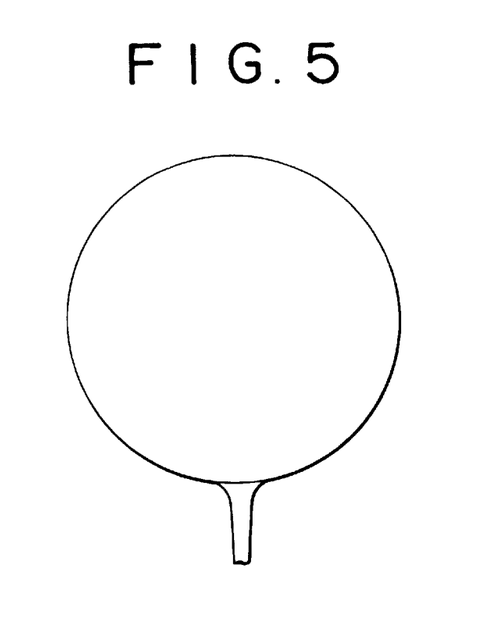
FIGS. 5 and 6 are plan views of typical grids.
Figure 6:
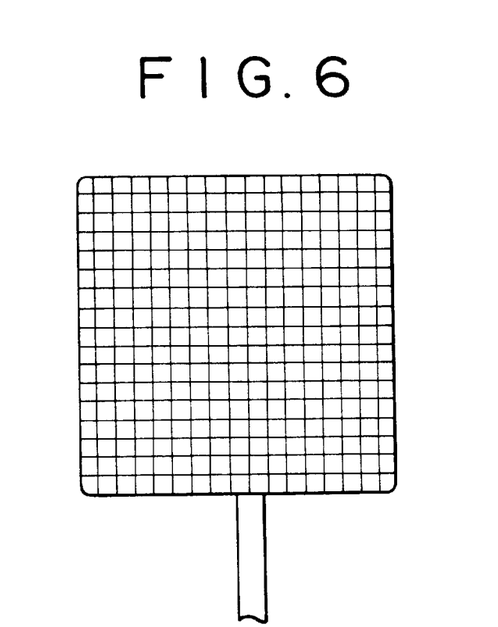

Referring to the drawings, the apparatus shown in FIG. 1 is a modified microwave CVD apparatus of the kind available from Applied Science & Technology Inc. of Woburn, Mass., USA. Plasma is generated by a 1.5 kW microwave power source 2, which is coupled to a microwave chamber 4. The chamber 4 includes means (not shown) for evacuating to a high vacuum and for introducing amounts of hydrogen and carbon-containing gases. A plasma ball 5 is generated in the region of a substrate 12 which is supported on a platform 6. The platform includes a graphite susceptor 16. The platform need not consist wholly of graphite but may comprise a graphite susceptor with a refractory metal cap, e.g. of molybdenum. The platform is mounted on a motor-driven stem so that it can be raised and lowered to adjust the position of the substrate relative to the plasma ball and an electrode 20. The electrode 20 in the form of a grid, e.g. as shown in FIGS. 5 and 6 is fixed to the chamber wall 3 and is connected to an electrical power supply 9. The material of the grid is a refractory metal and preferred metals are molybdenum, tungsten or tantalum. The grid may be mounted on an adjustable support, but its relative position with respect to the substrate may be varied by adjusting the height of the platform.

Figure 4:
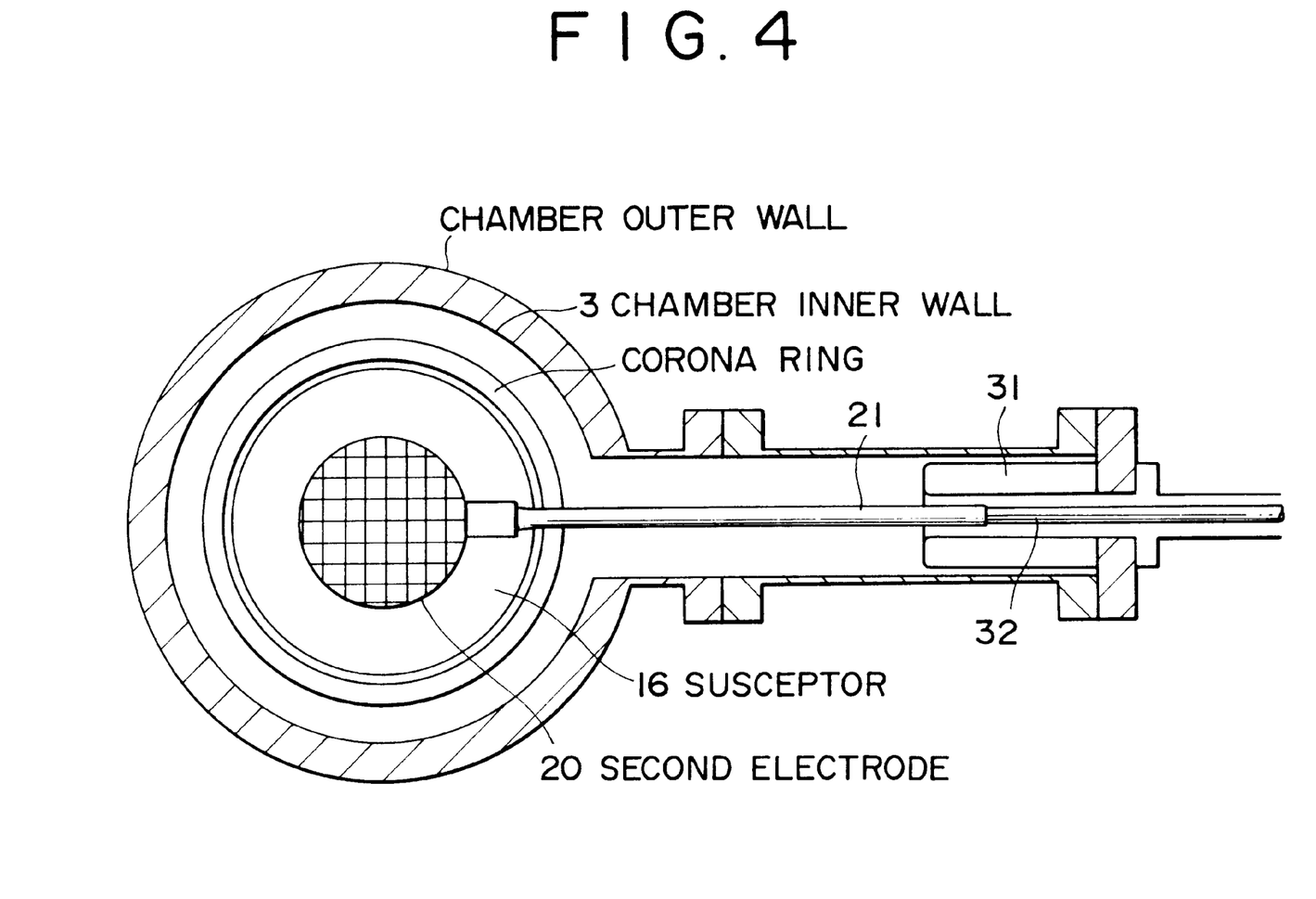
FIG. 4 is a plan view of the electrode and chamber as shown in FIG. 3.

The electrode is preferably, essentially, planar and three possible designs are shown in FIGS. 4, 5 and 6. Normally, the outline shape of the electrode would generally correspond with the cross-sectional shape of the microwave CVD chamber in which the substrate is nucleated, e.g. a circular electrode is preferred for use in a cylindrical CVD chamber. The electrode does not have to fill the chamber and its size can be tailored to suit a specific application. For example, the diameter of the electrode may correspond closely with the diameter of the substrate of large area, uniform nucleation is required. Alternatively, it may be designed specifically to produce nucleation at selected areas of the substrate surface. In the mesh grid shown in FIGS. 4 and 6, the thickness of the strand was from about 0.1 to 2 mm and the grid spacing was generally at least 3 mm, preferably at least 5 mm.

In the case of the design shown in FIG. 5, a ring is employed. The thickness of material comprising the ring is 0.1~5 mm and the diameter of the grid corresponds closely with the diameter of the silicon wafer employed as a substrate (approximately 50 mm).

Figure 2:
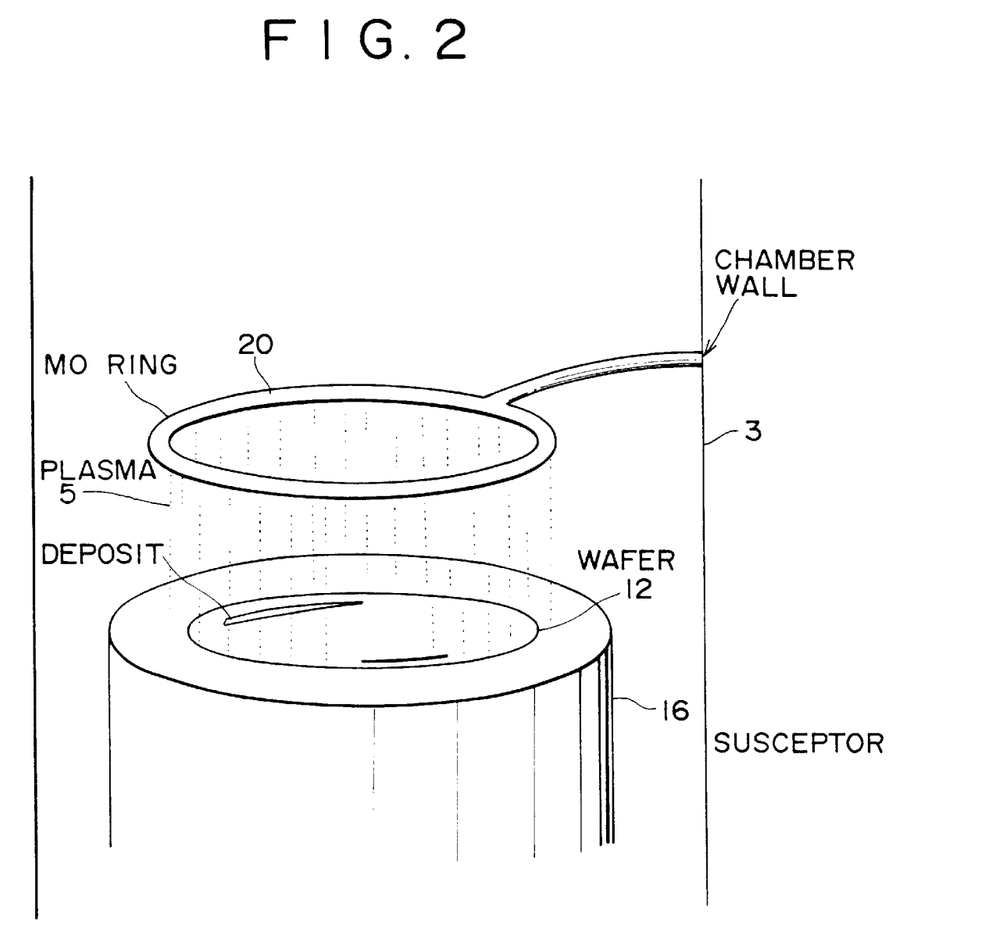
FIG. 2 is a schematic view on a larger scale showing the interaction of the grid with the plasma and the silicon wafer.

FIG. 2 shows schematically the position of the silicon wafer with respect to the electrode and the plasma. The effect of the grid is to control the species generated by the plasma, for example, in order to spread these more uniformly over the silicon wafer surface.

Figure 3:
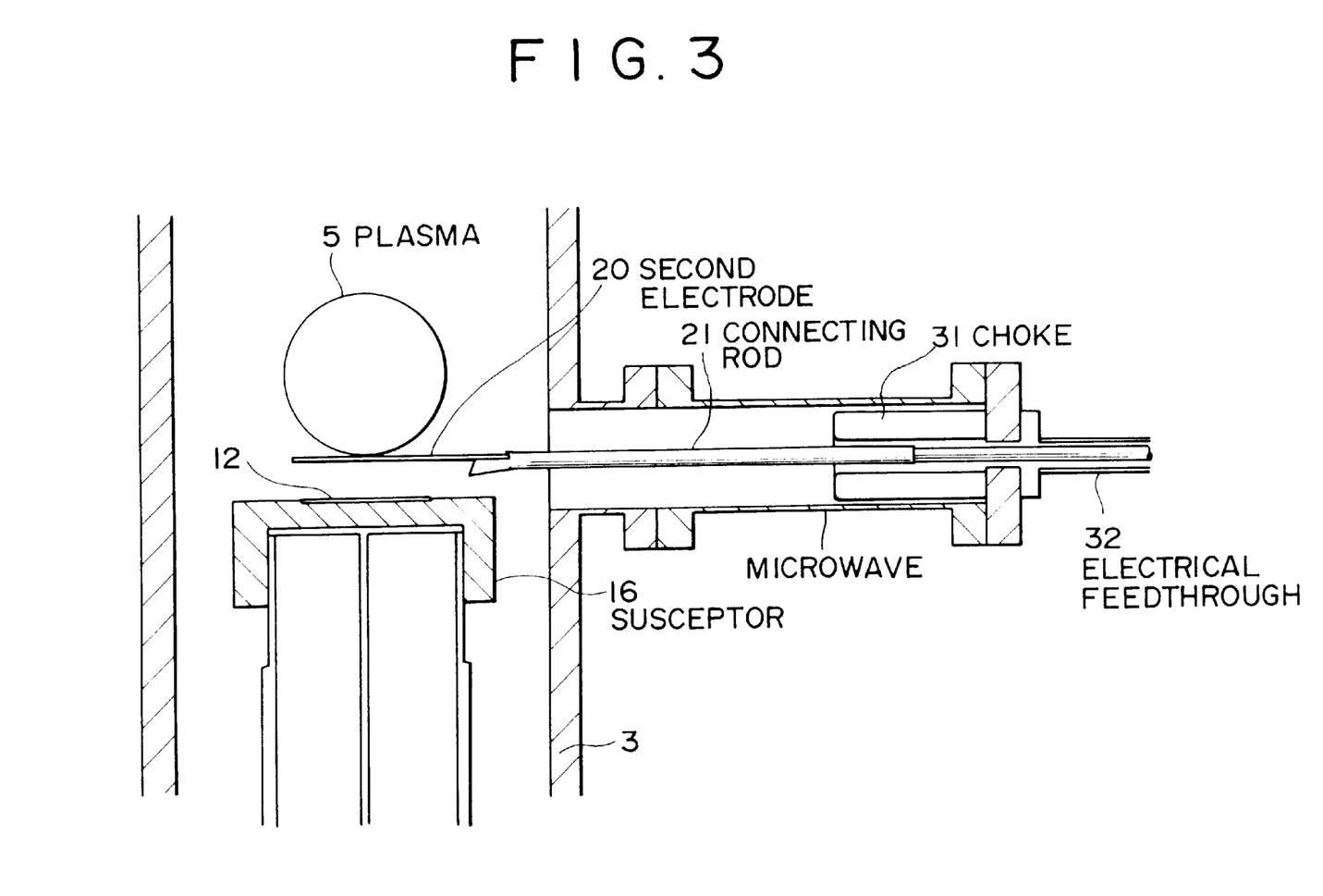
FIG. 3 is an elevation, partly in section, showing one way in which the grid can be fitted into the wall of the CVD chamber.

FIG. 3 shows one way in which a threaded molybdenum bar 21 forming part of the electrode was fitted into the chamber wall 3 and connected to an electrical feed 32, via a microwave choke 31. The purpose of the choke is, of course, to minimise stray microwave leakage from the flange in the wall of the chamber. The choke assembly surrounds the electrical feed to the grid arm.

Using the apparatus described above, diamond depositions were conducted using 2" circular silicon wafers, supported on the susceptor. Prior to conducting the depositions, the grid components were cleaned by placing them in acetone in an ultrasonic bath for 10 minutes, followed by a rinse in isopropyl alcohol. The electrical feed through, including the microwave choke, were then fitted to the chamber. Vacuum integrity was checked and a plasma was ignited to check for plasma disturbance and microwave leakage. A distance between the grid and the susceptor of approximately 10 mm was defined to allow clearance between the grid and the substrate.

When forming a plasma at 800° C. and microwave power of 800 W, the plasma was significantly distorted by the presence of the grid. The plasma position was optimised by varying the power, temperature and gas pressure and by varying the height of the susceptor. Desirably, the electrode is not in direct contact with the susceptor and, generally, the electrode is spaced therefrom. The most stable plasma was formed with a grid/susceptor separation of 2~15 mm, preferably 2~5 mm, e.g. about 3 mm. The grid shown in FIG. 5 produced the most stable plasma over the widest range of conditions.

Figure 10A:
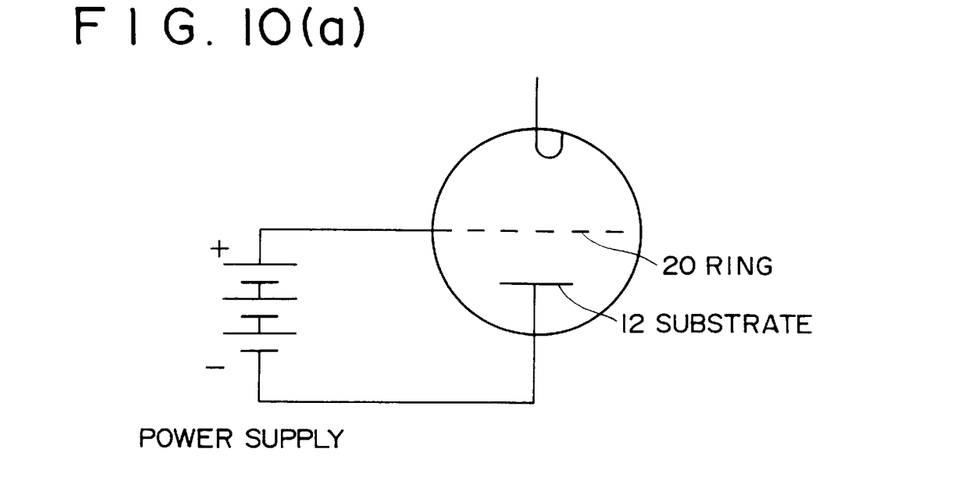
Figure 10B:
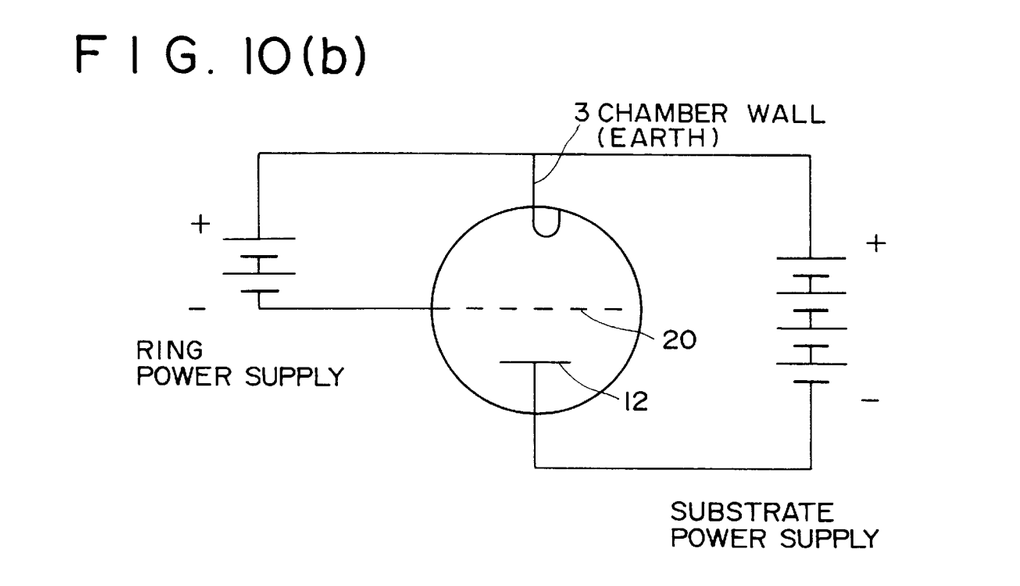

FIGS. 10(a) and (b) show ways in which the electrode and the substrate can be connected to electrical sources and various polarities and voltages applied. Using circuit arrangements of the kind shown in FIGS. 10(a) and (b), the application of negative electrical bias to the electrode in conjunction with negative substrate biasing was studied. The limits of substrate bias current and electrode bias voltage to achieve a stable plasma were from about 0.3 to 1 amps substrate current and electrode bias voltage of 60 to 600V. The lower limit of electrode voltage could not be extended below 60 V as this voltage was induced on the electrode by application of the substrate bias.

The effect of changing electrode bias from negative to positive was also studied. This appeared to have relatively little effect on the plasma, whether the system has negative bias to electrode and substrate or positive bias to the electrode and negative bias to the substrate. However, the sequence by which the biases are applied appears to be of some significance. When the negative bias is applied first and then a positive electrode bias voltage increased, the voltage on the substrate drops but the current remains constant.

In contrast, when the electrode voltage is set first and then the substrate current is increased, a very low voltage is observed on the substrate but the current on the electrode and substrate are equal.

It is also possible to use only one power supply for biasing both the electrode and the substrate. In this embodiment, the positive side of the power supply was connected to the electrode instead of to earth, while the negative terminal was connected to the substrate.

In all experiments, nucleation was carried out until the end point was observed using the optical pyrometer. In general, it was preferred to utilise a low current in the electrode and substrate. After nucleation was complete, diamond films were grown using the diamond growth conditions described in our above British Patent Application. All the diamond films grown in the experiments were highly (100) textured over an area approximately 15 mm in diameter.

From examination of the resulting diamond films, it seems clear that the electrode affected the plasma shape in a beneficial way. The growth of a standard highly oriented diamond film with an electrode in the chamber, however, required an increase in microwave power, probably to offset the heat sinking effect of the electrode. The nucleation density produced by electrode biasing does not appear to differ from that observed using biasing of the substrate. The growth rate of diamond is approximately double that observed using standard bias-enhanced nucleation, and the average facet size of the grown diamond films is approximately four times greater than that seen using the standard bias-enhanced nucleation process.

Figure 7:
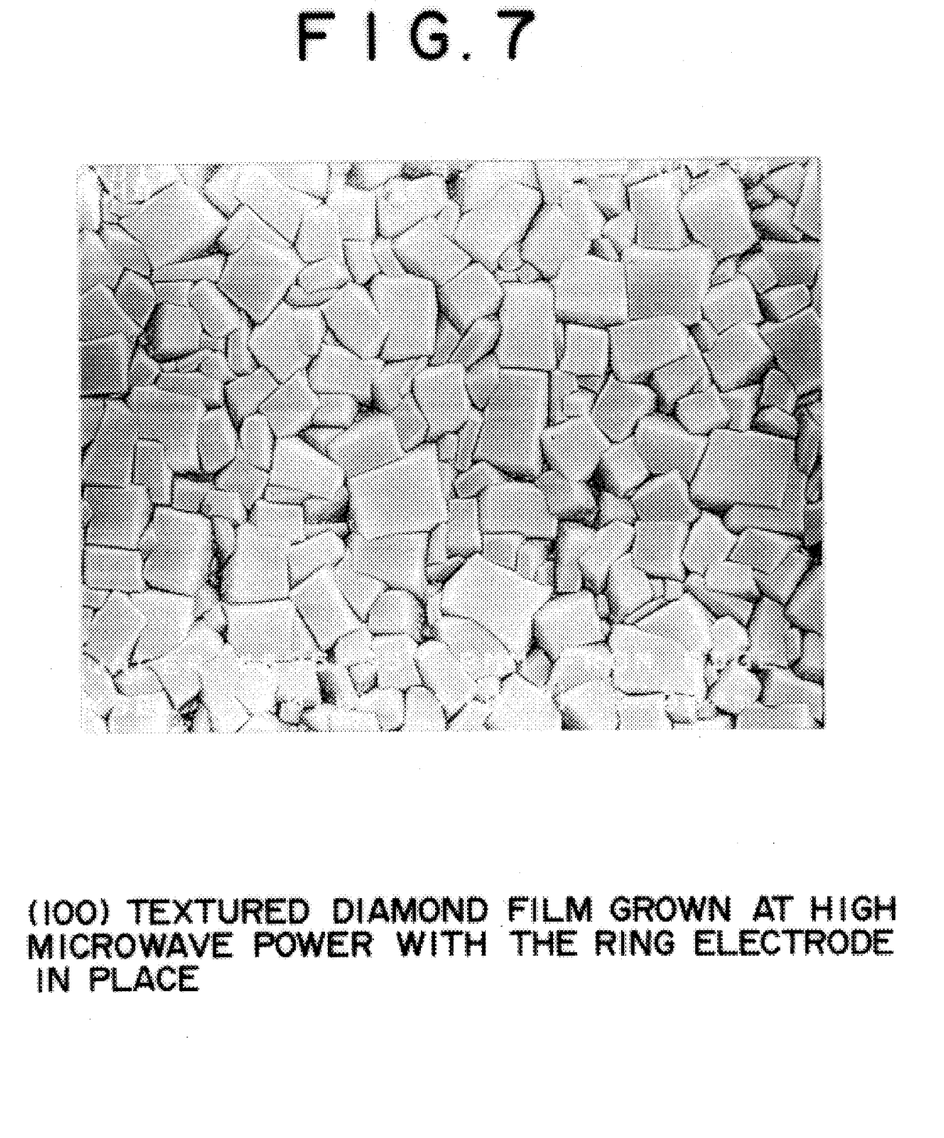
FIGS. 7 and 8 are photomicrographs of textured diamond films grown in accordance with the process of the invention.
Figure 8:
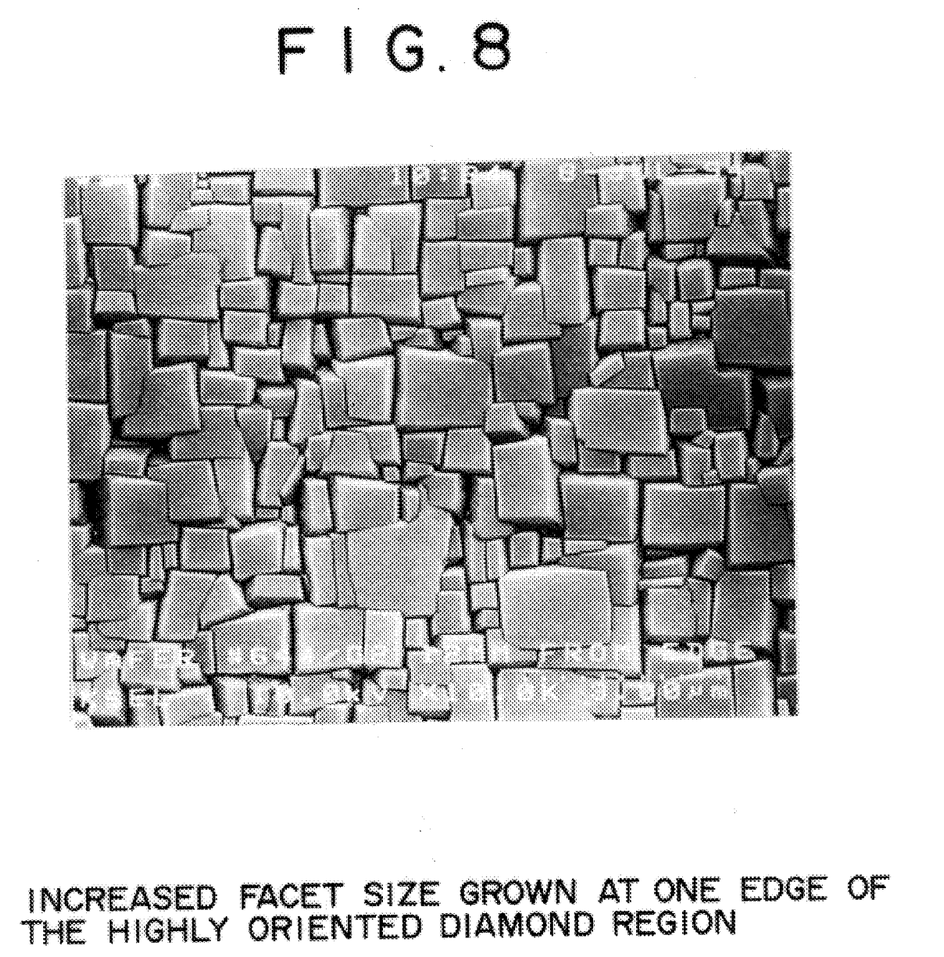
Figure 9:
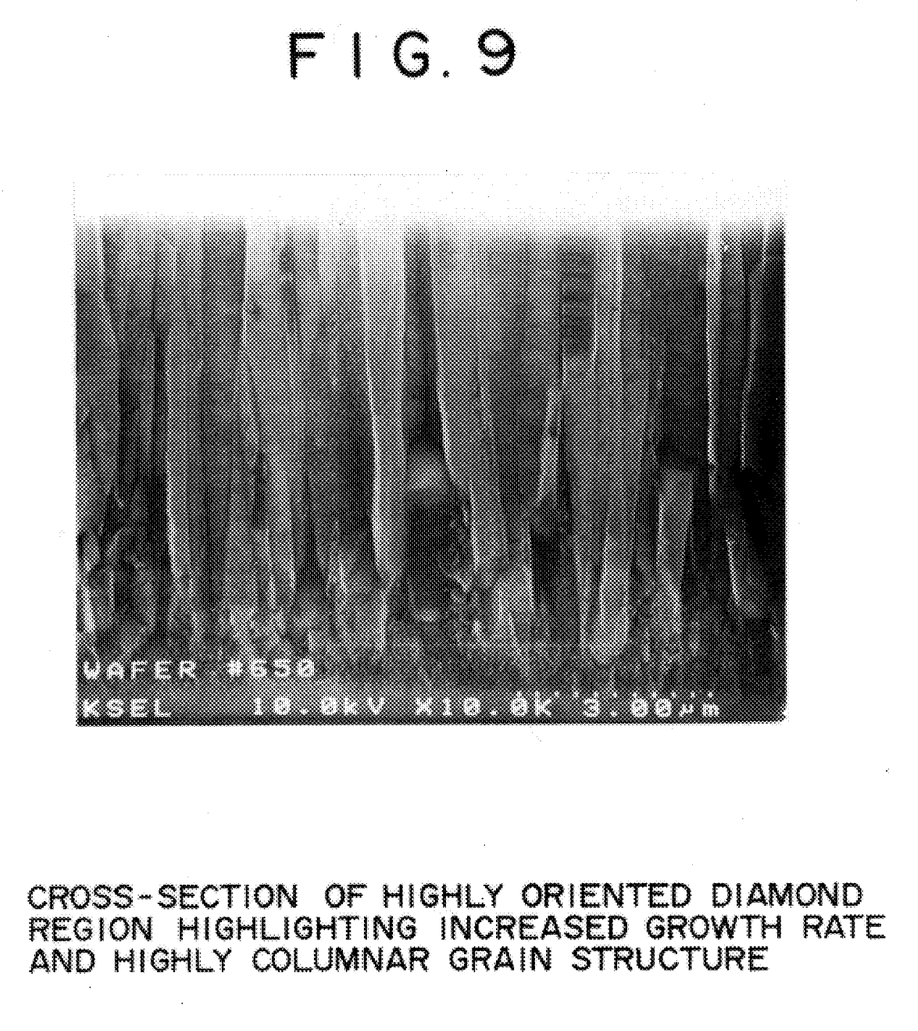
FIG. 9 is a cross-section through the diamond films of FIGS. 7 and 8.

Applying negative biasing of both the substrate and the electrode during the nucleation of a 50 mm silicon wafer, microwave power of 800 W was employed using the general conditions described in our above British Patent Application. When the nucleation step had been concluded using the end pointing technique mentioned above, microwave power was increased to about 1300 W, and a diamond film grown for about 20 hours. In the diamond growth stage, gas pressure and methane content were increased. Well faceted, highly oriented diamond films of good quality were obtained, as illustrated in FIGS. 7, 8 and 9.

In the above description and accompanying drawings, apparatus has been described in which the electrode remains within the chamber during the entire procedure of conditioning the substrate and depositing the diamond film.

Alternatively, the electrode may be introduced into the CVD chamber for a specific processing step, e.g. the bias nucleation step, and a subsequent processing step, e.g. diamond growth, carried out in the absence of the electrode.

We claim:

1. A method of growing a diamond film by microwave chemical vapour deposition (CVD) on a non-diamond substrate which comprises effecting nucleation of the substrate surface for diamond growth by subjecting the surface to a microwave plasma while applying an electrical bias to the substrate surface, wherein an electrode is introduced into the microwave plasma and above or adjacent to the substrate surface and crystalline diamond is deposited on the resulting nucleated surface from a carbon-containing plasma.

2. A method according to claim 1 wherein the plasma is microwave-generated and the diamond film is oriented.

3. A method according to claim 2 wherein the electrode extends in a plane which is substantially parallel to the substrate surface.

4. A method according to claim 3 wherein the electrode comprises a frame which is open or bridged with one or more cross-pieces.

5. A method according to claim 4 wherein the electrode has a mesh-like structure.

6. A method according to claim 1 wherein the substrate is subjected to a negative bias during nucleation of the substrate surface.

7. A method according to claim 6 wherein the electrode is subjected to a negative bias during nucleation of the substrate surface.

8. A method according to claim 7 wherein the electrode bias voltage is from 60 to 500V.

9. A method according to claim 6 wherein said negative bias is maintained until nucleation is substantially complete.

10. A method according to claim 9 wherein the end of the nucleation phase is detected by determining when the apparent temperature of the surface markedly increases.

* * * * *